United States Patent
Hafizovic et al.

(10) Patent No.: US 8,841,964 B2
(45) Date of Patent: Sep. 23, 2014

(54) APPARATUS AND METHOD FOR DEMODULATING AN INPUT SIGNAL

(75) Inventors: Sadik Hafizovic, Zürich (CH); Flavio Heer, Dübendorf (CH); Stefan Koch, Langnau am Albis (CH); Niels Haandbaek, Zürich (CH)

(73) Assignee: Zurich Instruments AG (CH)

( * ) Notice: Subject to any disclaimer, the term of this patent is extended or adjusted under 35 U.S.C. 154(b) by 55 days.

(21) Appl. No.: 13/578,421

(22) PCT Filed: Mar. 10, 2010

(86) PCT No.: PCT/CH2010/000066
§ 371 (c)(1),
(2), (4) Date: Aug. 10, 2012

(87) PCT Pub. No.: WO2011/109913
PCT Pub. Date: Sep. 15, 2011

(65) Prior Publication Data
US 2012/0313697 A1    Dec. 13, 2012

(51) Int. Cl.
*H03D 3/04*     (2006.01)
*H03D 1/22*     (2006.01)
*H03D 3/00*     (2006.01)

(52) U.S. Cl.
CPC . *H03D 3/006* (2013.01); *H03D 1/22* (2013.01)
USPC .............. 329/327; 329/304; 850/21; 850/8; 250/306; 73/105; 73/504.03; 324/72; 324/681

(58) Field of Classification Search
CPC .............. H03D 3/24; G01Q 60/00; H01J 3/14
USPC ............ 850/21, 8; 329/304, 327; 250/306; 73/105, 504.03; 324/72, 681
See application file for complete search history.

(56) References Cited

U.S. PATENT DOCUMENTS 5,222,254 A    6/1993    Verron et al. ............ 455/186.1
5,267,471 A    12/1993    Abraham et al. ............ 73/105
(Continued)

FOREIGN PATENT DOCUMENTS

DE    37 41 610    6/1989
EP    0 994 588    4/2000
(Continued)

OTHER PUBLICATIONS

International Search Report mailed Nov. 16, 2010 in corresponding PCT International Application No. PCT/CH2010/000066.

(Continued)

*Primary Examiner* — Arnold Kinkead
(74) *Attorney, Agent, or Firm* — Ostrolenk Faber LLP

(57) ABSTRACT

An apparatus for demodulating an input signal that includes a frequency detector for tracking a frequency of the input signal, an oscillator and a mixer is disclosed. The input signal and an output signal of the oscillator can constitute the incoming signals for the mixer and the output signal of the mixer can constitute the demodulated input signal, wherein an arithmetic unit is arranged downstream of the frequency detector and upstream of the oscillator, wherein the tracked frequency of the input signal and a predefined second frequency constitute the incoming signals of the arithmetic unit and the arithmetic unit is designed such that it computes a control signal for the oscillator from the tracked frequency of the input signal and the predefined second frequency with the output signal of the oscillator depending on the control signal.

12 Claims, 8 Drawing Sheets

(56) References Cited

U.S. PATENT DOCUMENTS

| | | | | |
|---|---|---|---|---|
| 5,544,662 | A | 8/1996 | Saulnier et al. | 128/734 |
| 5,673,291 | A | 9/1997 | Dent | 375/262 |
| 5,790,615 | A | 8/1998 | Beale et al. | 375/376 |
| 5,805,642 | A | 9/1998 | Wei et al. | 375/340 |
| 5,935,500 | A | 8/1999 | Stanton et al. | 264/219 |
| 5,939,715 | A | 8/1999 | Kitamura et al. | 250/234 |
| 5,952,879 | A | 9/1999 | de Ledinghen | 329/304 |
| 6,097,197 | A | 8/2000 | Matsuyama et al. | 324/750 |
| 6,181,258 | B1 | 1/2001 | Summers et al. | 340/870.28 |
| 6,275,020 | B1 | 8/2001 | Nagano | 324/76.27 |
| 6,508,110 | B1 | 1/2003 | Lin et al. | 73/105 |
| 6,714,025 | B2 | 3/2004 | Mohaupt et al. | 324/681 |
| 6,823,724 | B1 | 11/2004 | Kobayashi et al. | 73/105 |
| 6,970,738 | B1 | 11/2005 | Othman et al. | 600/547 |
| 2006/0148441 | A1 | 7/2006 | Zinser | 455/336 |
| 2007/0285078 | A1 | 12/2007 | Kusaka | 324/72 |
| 2011/0004967 | A1* | 1/2011 | Jesse et al. | 850/21 |
| 2013/0007929 | A1* | 1/2013 | Porthun | 850/8 |

FOREIGN PATENT DOCUMENTS

| | | |
|---|---|---|
| EP | 1 257 051 | 11/2002 |
| WO | WO 01/81857 | 11/2001 |
| WO | WO 2008/006229 | 1/2008 |

OTHER PUBLICATIONS

Takeshi Fukuma et al., "Surface potential measurements by the dissipative force modulation method", Review of Scientific Instruments, vol. 75, No. 11 (2004) pp. 4589-4594.

H.O. Jacobs et al., "Practical aspects of Kelvin probe force microscopy", Review of Scientific Instruments, vol. 70, No. 3 (1999) pp. 1756-1760.

Gunther Benstetter et al., "A review of advanced scanning probe microscope analysis of functional films and semiconductor devices", Thin Solid Films 517 (2009) pp. 5100-5105.

Th. Glatzel et al., "Amplitude or frequency modulation-detection in Kelvin probe force microscopy", Applied Surface Science 210 (2003) pp. 84-89.

Andrea Stefani et al., "Diagnosis of Induction Machines' Rotor Faults in Time-Varying Conditions", IEEE Transactions on Industrial Electronics, vol. 56, No. 11 (2009) pp. 4548-4556.

* cited by examiner

APPARATUS AND METHOD FOR DEMODULATING AN INPUT SIGNAL

CROSS-REFERENCE TO RELATED APPLICATION

The present application is a 35 U.S.C. §§371 national phase conversion of PCT/CH2010/000066, filed Mar. 10, 2010, the content of which is incorporated herein by reference. The PCT International Application was published in the English language.

TECHNICAL FIELD

The invention relates to an apparatus and a method for demodulating an input signal according to the preambles of the independent claims.

BACKGROUND

In many research areas and industrial applications such as material analysis and science, quantum physics, nanophysics, semiconductor devices, there is an increasing demand for apparatuses and methods for effectively measuring small electrical signals in noisy environments.

One known technique for recovering such a signal of interest employs for instance lock-in amplification, which is a particular type of demodulation with specific requirements for the performance of the employed filter. The demodulation is performed on the measured wide-band signal to obtain the amplitude and the phase of the signal of interest at a specific frequency, i.e. narrow-band.

Another known method for recovering a small oscillation in a measured signal tracks the oscillation frequency e.g. by means of a phase-locked loop. Instead of demodulating always at the same frequency, phase-locked loops can track variations in the frequency of the measured signal, which further improves oscillation signal recovery.

Several applications require the measurement of a signal of interest at frequencies that are different from the fundamental frequency (also called center or carrier frequency) of the signal of interest, such as e.g. at the higher harmonics which are given by the fundamental frequency multiplied by an integer factor, or at the sideband frequencies, respectively. The sideband frequencies are defined as frequencies at a defined distance above or below the fundamental frequency. Sideband frequencies typically occur in applications where amplitude and/or frequency modulation techniques are employed. In the following the term "sidebands" is used for the expression "sideband frequencies".

A known method for analyzing sidebands that occur in an amplitude or frequency modulated signal employs an apparatus 100 with two consecutive lock-in amplifiers, the apparatus 100 being depicted in FIG. 1. The apparatus 100 comprises a first mixer 102 for wide-band demodulation and a second mixer 104 for narrow-band demodulation of a measured input signal 101 with a fundamental frequency f2 and which has been modulated with a modulation frequency f1. The first mixer 102 has as incoming signals the measured input signal 101 and the output signal of a first oscillator 106 that has the frequency f2. In the first mixer 102 the input signal 101 is demodulated with the frequency f2 (wide-band demodulation). The output signal of the first mixer 102 is then low-pass filtered by a first low-pass filter 103 (LPF), the output signal of the first low-pass filter 103 having a spread spectrum around the frequency f2. The second mixer 104 has as incoming signals the output signal of the first low-pass filter 103 and the output signal of a second oscillator 107 with the frequency f1. In the second mixer 104 the output signal of the first low-pass filter 103 is demodulated at the frequency f1 (narrow-band demodulation). The output signal of the second mixer 104 is low-pass filtered by a second low-pass filter 105 (LPF). The output signal of the second low-pass filter 105 has the amplitude and the phase of the input signal 101 at the sidebands f2+f1 and f2−f1.

The known method employed by means of the apparatus 100 is known as spread spectrum demodulation or heterodyning in communication systems. It is also known as dual lock-in method in instrumentation. The term "spread spectrum demodulation" generally refers to any demodulation method that produces a signal with a spectrum that is much wider than the bandwidth of the signal of interest.

Another known example of an apparatus 200 employing spread spectrum demodulation is depicted in FIG. 2. The apparatus 200 comprises a mixer 203 with the input signal 201 and the output signal of an oscillator 202 as incoming signals. The mixer 203 produces as output signal a signal at a so-called intermediate frequency (IF). This signal is then low-pass filtered by a low-pass filter 206 (LPF) and further analyzed by using Fourier-transform-based methods by means of a Fourier-transform-unit 204 (FFT=fast Fourier transform). The first mixers 103, 203 depicted in FIGS. 1 and 2 often form part of a phase-locked loop for tracking the carrier/fundamental frequency.

An example of an application where the determination of sidebands is of interest is the analysis of the mechanical oscillation of a cantilever that is employed for surface potential measurements in scanning probe microscopy. For measuring surface potentials a cantilever is usually employed as mechanical oscillator to measure the surface topography as well as the electrostatic potential of a probe at atomic resolution. Typically a phase-locked loop is employed to track a resonance frequency f2 of the cantilever as it scans the surface of the probe. The cantilever is held close to its resonance frequency f2 by means of the phase-locked loop. Both amplitude and frequency modulation techniques are typically employed, i.e. the oscillation of the cantilever is amplitude or frequency modulated with a second frequency f1, with f1<f2. As a consequence of the modulation, sidebands occur at frequencies f2+f1, f2−f1 and possible other frequencies depending on the modulation method. The amplitudes of these sidebands are then measured to derive the surface potential. The standard method for measuring the amplitudes of the sidebands employs two consecutive lock-in amplifiers to perform a wide-band demodulation at the resonance frequency f2 and after that a narrow-band demodulation at the frequency f1 as shown in FIG. 1.

The disadvantage of the known methods is that they have two stages, i.e. two lock-in amplifiers or one lock-in amplifier and a Fourier-transform-unit. Hence, quite a lot of resources in form of signal processing units (mixers and filters) are necessary to analyze the input signal at a frequency of interest. Furthermore, with the known methods the amplitude and the phase can only be determined at sidebands in combination, i.e. it is not possible to look at each sideband separately.

DISCLOSURE OF THE INVENTION

It is an object of the invention to provide an apparatus and a method for demodulating an especially periodic input signal, that has been amplitude and/or frequency modulated at a specific frequency of interest, which in particular require few signal processing units. It is a further object of the invention to provide an apparatus and a method for demodulating an especially periodic input signal that has been amplitude and/or frequency modulated directly at the specific frequency of interest.

In order to implement these and still further objects of the invention, which will become more readily apparent as the description proceeds, an apparatus for demodulating an input signal is provided that comprises a frequency detector for tracking a frequency, in particular a carrier frequency, of the input signal, an oscillator and a mixer. The input signal and an output signal of the oscillator are the incoming signals of the mixer, the output signal of the mixer being the demodulated input signal. An arithmetic unit is provided downstream the frequency detector and upstream the oscillator. The tracked frequency of the input signal and a predefined second frequency are the incoming signals of the arithmetic unit. The arithmetic unit is designed such that it computes a control signal for the oscillator from the tracked frequency of the input signal and from the predefined second frequency. The output signal of the oscillator depends on the control signal. The output signal of the mixer is preferably filtered by a low-pass filter that is arranged downstream the mixer. The oscillator, the mixer and the optional low-pass filter may form part of a lock-in amplifier with the control signal that is computed by the arithmetic unit forming the reference signal for the lock-in amplifier.

The predefined second frequency is preferably given by the modulation frequency by which the input signal has been previously modulated. The control signal is preferentially a reference frequency for the oscillator, the reference frequency being in arithmetic relation to the tracked frequency of the input signal and to the predefined second frequency. The output signal of the oscillator has then the amplitude and phase at the reference frequency.

If the amplitude and the phase of the input signal at the sideband frequencies are of interest, then the reference frequency is given by the difference and/or the sum of the tracked carrier frequency of the input signal and the predefined second frequency, the predefined second frequency in this case being the modulation frequency.

The frequency detector of the apparatus of the invention can comprise a phase detector and/or can be designed as phase-locked loop that tracks a free-running oscillation frequency. The output signals of the frequency detector are, hence, frequencies and/or phase shifts which are in particular represented as e.g. analogue voltage signals in analogue systems or as phase steps in digital systems. The output signals of the frequency detector are related to the physical properties of the system/device from which the measured input signal stems. The frequency detector may be implemented as phase-locked loop that continuously drives the oscillation device under test at resonance in closed-loop mode and that may for example be used for tracking the resonance frequency of a mechanical oscillator.

Furthermore, a method for demodulating an input signal by means of an apparatus according to the invention is provided, the method according to the invention comprising the steps of tracking a frequency (in particular a carrier frequency) of an input signal by means of a frequency detector, computing a control signal from the tracked frequency of the input signal and a predefined second frequency (in particular a modulation frequency of the input signal) by means of an arithmetic unit, generating an output signal of an oscillator from the computed control signal, and demodulating the input signal by mixing it with the output signal of the oscillator by means of a mixer. The demodulated input signal is preferably low-pass filtered.

The apparatus and the method of the invention have the advantage that they require relatively few signal processing units such as mixers and filters for demodulating an input signal at a frequency of interest (e.g. the above-mentioned reference frequency), in particular if implemented in digital circuitry. Moreover, they offer a high flexibility for the generation of the reference frequency used for the demodulation. Further, the apparatus and the method of the invention permit measurements of separated and even asymmetrical sidebands, respectively. Furthermore, the input signal is directly demodulated at the frequency of interest, i.e. there is only one demodulation step instead of two demodulation steps with two cascaded lock-in amplifiers or with one lock-in amplifier and a consecutive Fourier-transform-unit, respectively, as above stated for known apparatuses and methods. With the apparatus and the method of the invention shorter signal processing paths for obtaining the demodulated input signal can thus be achieved, which allows for improved signal quality and requires less resources. The apparatus and the method of the invention are very well suited for digital implementations which avoids in particular drift and matching problems, but they can also be implemented as analogue circuit.

BRIEF DESCRIPTION OF THE DRAWINGS

Further advantageous features and applications of the invention can be found in the depending claims as well as in the following description of the drawings illustrating the invention. In the drawings like reference signs designate the same or similar parts throughout the several figures of which:

FIGS. 1 and 2 have already been described in the introductory part of the description and it is referred thereto.

MODES FOR CARRYING OUT THE INVENTION

Figure 1:
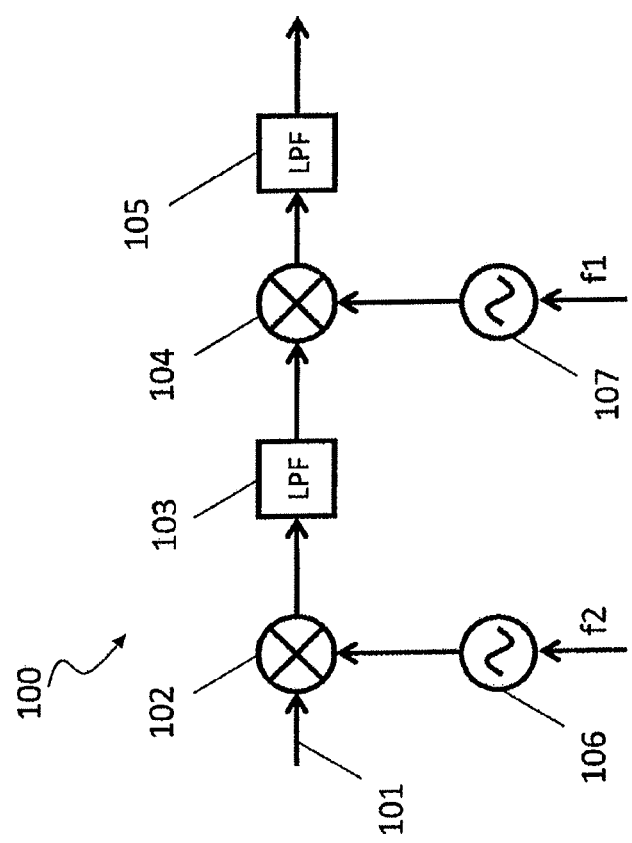
FIG. 1 depicts a schematic representation of an apparatus for demodulating an input signal at its sidebands according to the state of the art.
Figure 2:
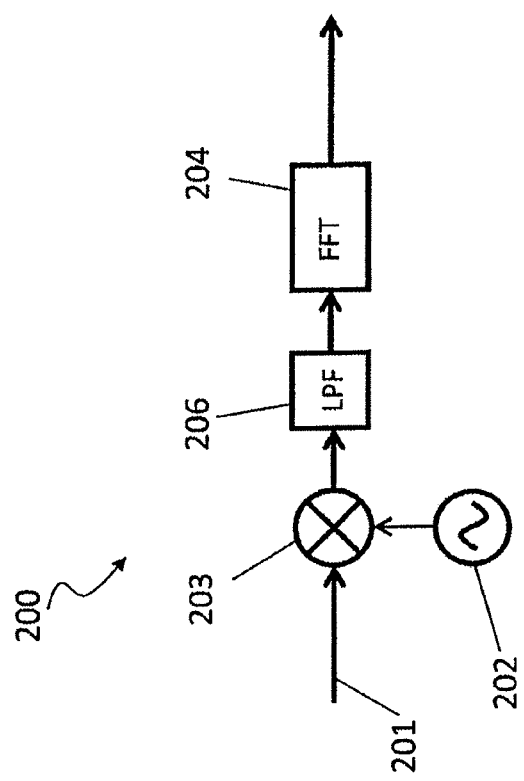
FIG. 2 depicts a schematic representation of a further apparatus for demodulating an input signal at its sidebands according to the state of the art.
Figure 3:
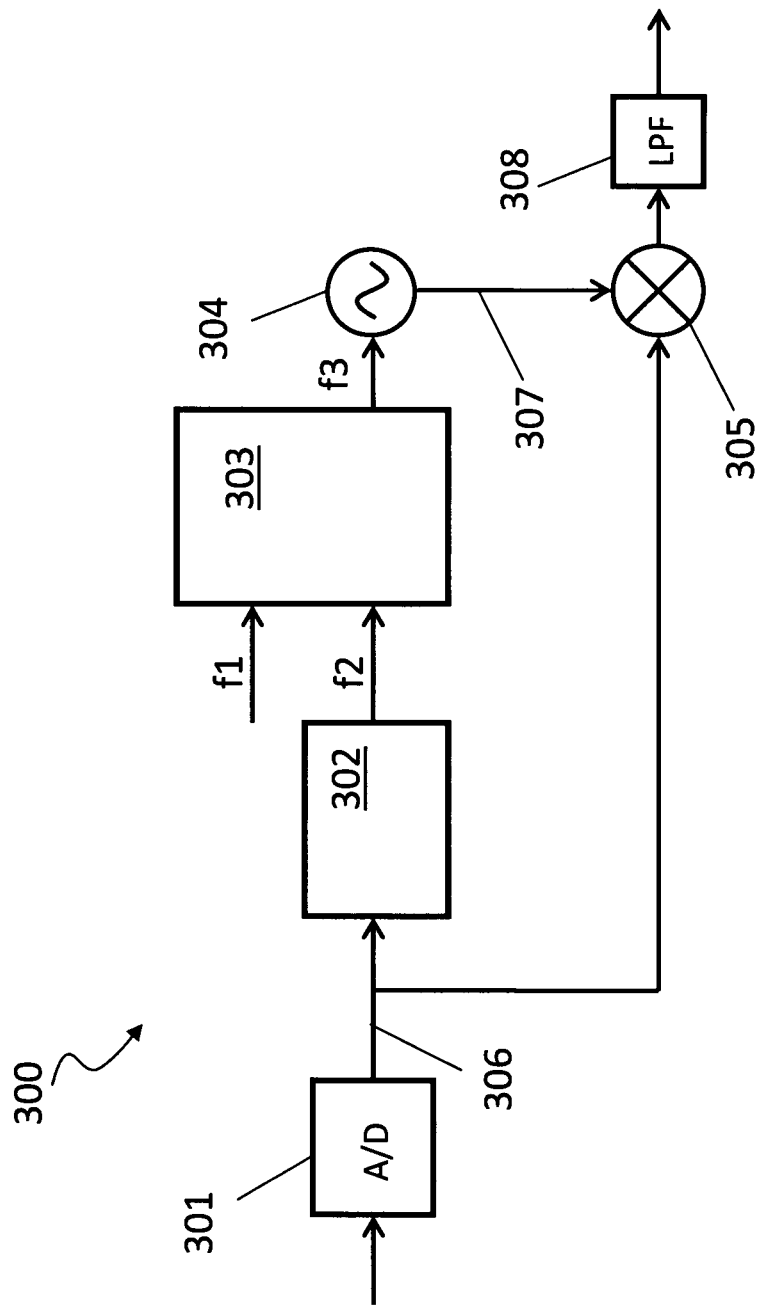
FIG. 3 depicts a schematic representation of a first embodiment of an apparatus according to the invention.

FIG. 3 shows a first preferred embodiment 300 of an apparatus according to the invention. The apparatus 300 comprises a frequency detector 302 for detecting a frequency f2, in particular a carrier and/or oscillation frequency, in an input signal 306, which may e.g. stem from a transducer or a sensor. If the apparatus 300 is implemented as digital system then an analogue-to-digital converter 301 is employed to convert the analogue input signal to the discrete input signal 306. For demodulating the input signal 306 it is fed to a mixer 305 as incoming signal. Of course more than one mixer 305 can be used, in particular if the input signal 306 shall be demodulated at several frequencies (confer FIG. 7 and description thereof).

The second incoming signal 307 of the mixer 305 that is used for demodulating the input signal 306 is derived from the input signal 306 itself. The second incoming signal 307 of the mixer 305 is also referred to as reference signal. The frequency f2 of the input signal 306 that is detected by the frequency detector 302 is fed to an arithmetic unit 303 as incoming signal. Furthermore, the arithmetic unit. 303 receives a predefined second frequency f1. The arithmetic unit 303 then computes a reference frequency f3 as output signal from the tracked/detected frequency f2 of the input signal 306 and from the predefined second frequency f1 by an arithmetic operation. The reference frequency f3 constitutes a control signal for the oscillator 304 of the apparatus 300 and is fed to the oscillator 304. The oscillator 304 generates as output signal the reference signal 307 for the mixer 305, the frequency of the reference signal 307 being given by the reference frequency f3. Hence, the input signal 306 is demodulated at the reference frequency f3 by means of the mixer 305. The demodulated input signal that forms the output of the mixer 305 has the amplitude and the phase of the input signal 306 at the reference frequency f3. Downstream the mixer 305 is preferably provided a low-pass filter 308 (LPF) for low-pass filtering the demodulated input signal.

Figure 4:
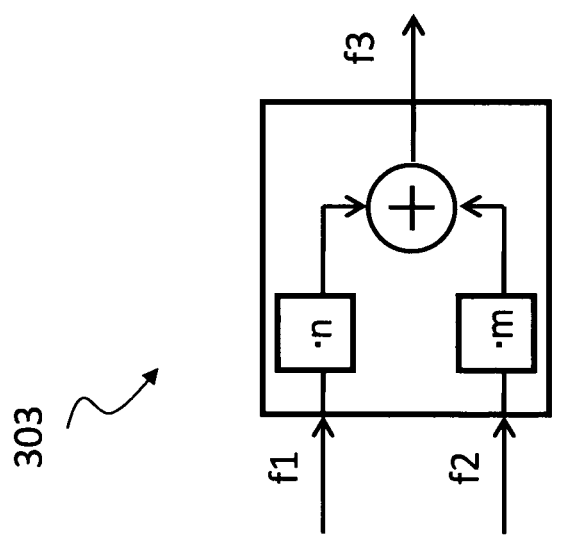
FIG. 4 depicts a schematic representation of an exemplary arithmetic unit of an apparatus of the invention.

FIG. 4 depicts an exemplary arithmetic unit 303 that performs an arithmetic operation on the tracked frequency f2 of the input signal 306 and on the predefined second frequency f1 to generate a control signal f3 for the oscillator 304. The arithmetic operation that the arithmetic unit 303 performs can for example be addition (f2+f1), subtraction (f2−f1), multiplication (m·f2, with m being an arbitrary real number), or division (1/n·f2, with n being an arbitrary real number), integration over time ($\int f2 \cdot dt$) and differentiation over time (df2/dt), or any combination thereof. In FIG. 4 the control signal f3 (here: the reference frequency) is exemplarily given by the equation f3=m·f2+n·f1, with m and n being arbitrary real numbers.

The frequency f2 of the input signal 306 that is recovered by the frequency detector 302 is for example the carrier frequency of the input signal 306. The predefined second frequency f1 is preferably chosen in dependence on the physical system or physical problem, respectively, that is analyzed by means of the apparatus and the method of the invention. The predefined second frequency f1 can e.g. be given a constant (i.e. a constant frequency) depending on or given by for example the time constant and/or the damping of the physical system to be analyzed, the physical system for example being a mechanical resonator. The predefined second frequency f1 can also be algorithmically generated. The predefined second frequency f1 is preferably smaller than the tracked frequency f2 of the input signal.

Figure 5:
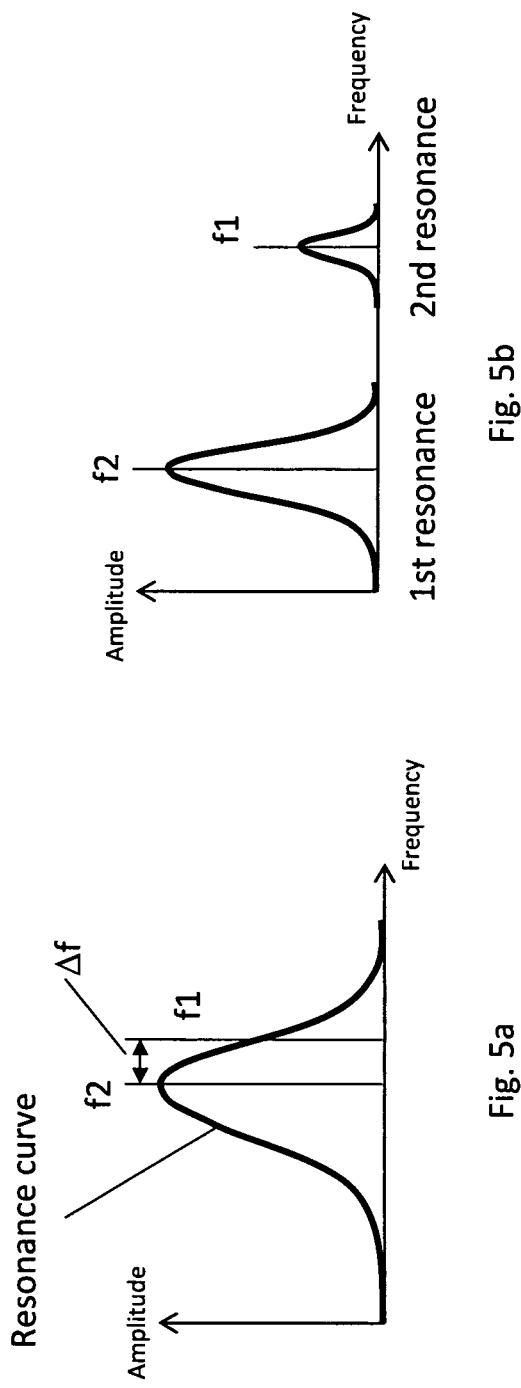
FIGS. 5a and 5b depict two exemplary curves illustrating how to choose the predefined second frequency.

FIG. 5a shows an exemplary resonance curve of a physical system to be analyzed in form of a mechanical oscillator, the resonance curve being exemplarily used for the derivation of the second frequency f1. The resonance frequency of the mechanical oscillator is the tracked frequency f2 of the input signal of the frequency detector 302 of the apparatus 300. The predefined second frequency f1 is then chosen very close to the tracked frequency f2, such that while being close to the resonance frequency it still can be distinguished from it. In FIG. 5a the difference between the frequencies f1 and f2 is denoted Δf.

FIG. 5b depicts a curve showing the first and the second resonance modes/frequencies of a mechanical oscillator/system to be analyzed. In this case the first resonance frequency represents the frequency f2 that is tracked by the frequency detector 302 of the apparatus 300, whereas the predefined second frequency f1 is chosen as the resonance frequency at a higher resonance mode.

The predefined second frequency f1 may also depend on e.g. the signal bandwidth if the physical system to be analyzed is for example a communication system. The predefined second frequency f1 may also be a further frequency of the input signal 306 that has been tracked by a second frequency detector (confer FIG. 5b; see FIG. 7 for an embodiment of the apparatus of the invention with several frequency detectors).

Figure 6:
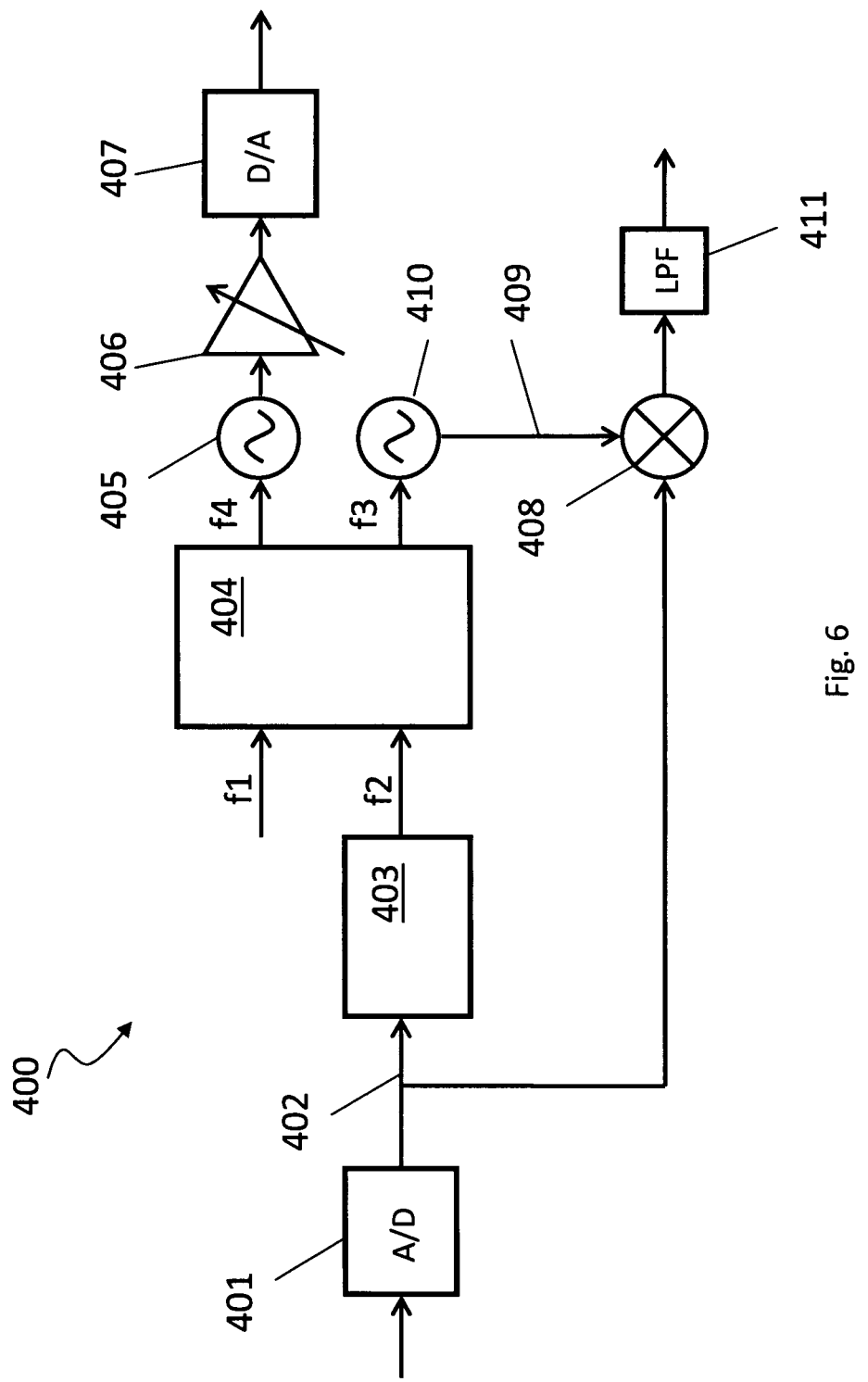
FIG. 6 depicts a schematic representation of a second embodiment of an apparatus according to the invention.

FIG. 6 shows a second embodiment of an apparatus 400 according to the invention with the arithmetic unit 404 generating a second control signal f4. The analogue-to-digital converter 401, the input signal 402, the frequency detector 403, the mixer 408, the oscillator 410, the low-pass filter 411, and the second incoming signal 409 of the mixer 408 of the apparatus 400 basically correspond to the analogue-to-digital converter 301, the input signal 306, the frequency detector 302, the mixer 305, the oscillator 304, the low-pass filter 308, and the second incoming signal 307 of the mixer 305 of the apparatus 300 depicted in FIG. 3 and it is referred to the corresponding above description.

The arithmetic unit 404 of the apparatus 400 differs from the arithmetic unit 303 of the apparatus 300 in that the arithmetic unit 404 computes in addition to the control signal f3 a second control signal f4 for a second oscillator 405 from the tracked frequency f2 of the input signal 402 and the predefined second frequency f1. The output signal of the second oscillator 405 depends on the second control signal f4 that in particular is given by a reference frequency such that the output signal of the second oscillator 405 has the reference frequency f4 as frequency. The second oscillator 405 is connectable to a device (not shown) to be tested by the apparatus 400. If the device to be tested is an analogue device, the second oscillator 405 is connected to the device to be tested via a digital-to-analogue converter 407 to drive the device under test, i.e. the output signals of the digital-to-analogue converter 407 are the drive signals for the device under test. A variable gain amplifier 406 is preferably provided downstream the oscillator 405 and upstream the digital-to-analogue converter 407, if the latter is required.

The control signal f4, which is in particular a reference frequency, is derived from the tracked frequency f2 of the input signal 402 and from the predefined second frequency f1 similar as the control signal f3. In this respect it is referred to the above description for the control signal f3 in relation with FIG. 4. That is the control signal f4 is preferably given by an arbitrary arithmetic function of the tracked frequency f2 of the input signal 402 and of the predefined second frequency f1 that is implemented in the arithmetic unit 404. If appropriate for the device to be tested, i.e. for the particular application of the apparatus 400, the control signal f4 may be equal to the tracked frequency f2 of the input signal 402 with a phase-locked loop operation being performed. For the derivation of the control signal f3 for the oscillator 410 it is referred to the above description for the control signal f3.

Figure 7:
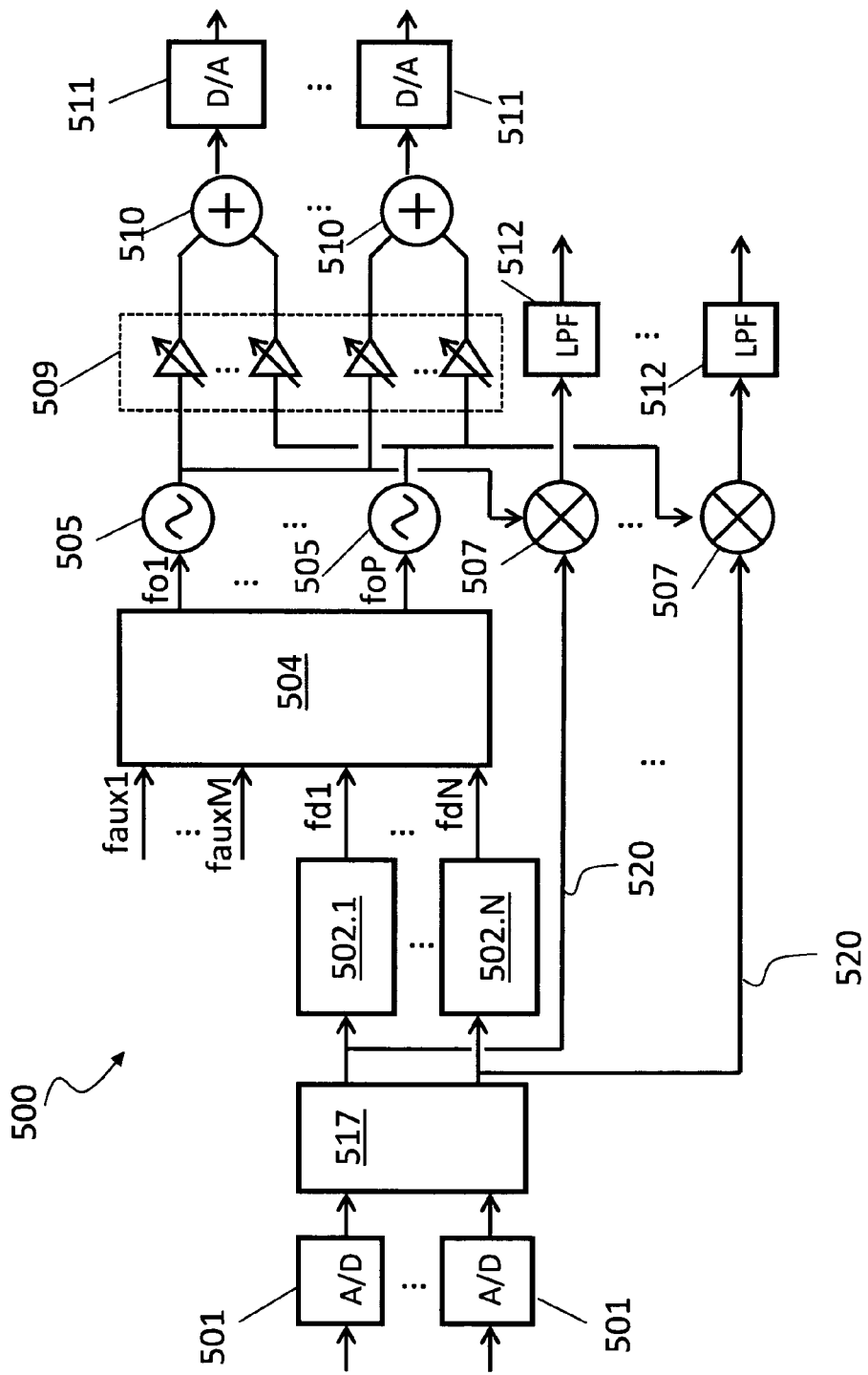
FIG. 7 depicts a schematic representation of a third embodiment of an apparatus according to the invention designed for multi-frequency applications.

FIG. 7 shows a third embodiment 500 of an apparatus of the invention. With the apparatus 500 several frequencies fd1 to fdN of an input signal 520 can be tracked concurrently and the input signal 520 can be demodulated at several frequencies fo1 to foP that have been computed by an arithmetic unit 504. The frequencies fd1 to fdN correspond to the frequency f2 mentioned in conjunction with the previous figures. For tracking the several frequencies fd1 to fdN several frequency detectors 502.1 to 502.N are provided, each for tracking one of the frequencies fd1 to fdN. The frequency detectors 502.1 to 502.N are routed to analogue-to-digital converters 501 and the input signals, respectively, via a switch matrix 517.

Downstream the frequency detectors 502.1 to 502.N the arithmetic unit 504 is arranged. The arithmetic unit 504 has as incoming signals the tracked frequencies fd1 to fdN of the input signal 520 and the predefined frequencies faux1 to fauxM, whereby the number N of the tracked frequencies fd1 to fdN of the input signal 520 does not necessarily need to be equal to the number M of the predefined frequencies faux1 to fauxM. The predefined frequencies faux1 to fauxM correspond to the predefined frequency f2 mentioned in conjunction with the previous figures. The predefined frequencies faux1 to fauxM can be fixed or variable or can e.g. be computed from a previously derived theoretical model. The principles described in connection with FIGS. 5a and 5b for choosing the predefined frequency f2 basically apply to the predefined frequencies faux1 to fauxM.

The arithmetic unit 504 computes from the tracked frequencies fd1 to fdN of the input signal 520 and from the predefined frequencies faux1 to fauxM control signals fo1 to foP for a certain number P of oscillators 505, wherein P can be different from N and/or M and each oscillator 505 is assigned one of the control signals fo1 to foP with the control signals fo1 to foP being preferably reference frequencies for the output signals of the oscillators 505. The output signal of each oscillator 505 depends on its associated control signal fo1, ..., foP. There is provided one mixer 507 for the output signal of each oscillator 505, the output signal of the respective oscillator 505 representing the incoming reference signal for the respective mixer 507. The other incoming signal of each mixer 507 is the input signal 520. Thus, for the control signals fo1 to foP being reference frequencies, the input signals 520 are demodulated at the reference frequencies fo1 to foP by means of the mixers 507 yielding output signals of the mixers 507 with the amplitude and phase of the input signal 520 at the frequencies fo1 to foP. Downstream each mixer 507 is preferably a low-pass filter 512 arranged.

As with the embodiment 400 shown in FIG. 6, the apparatus 500 is preferably employed to drive devices under test (not shown), wherein the output signals of the oscillators 505 are used for deriving the drive signals. Downstream the oscillators 505 a set of parallel variable gain amplifiers 509 and, following this, adders 510 are provided for generating weighted sums of the output signals of the oscillators 505. The output signals of the adders 510 then provide via digital-to-analogue converters 511 (if applicable) the drive signals for the devices under test. In such a way several devices can be tested simultaneously.

Figure 8:
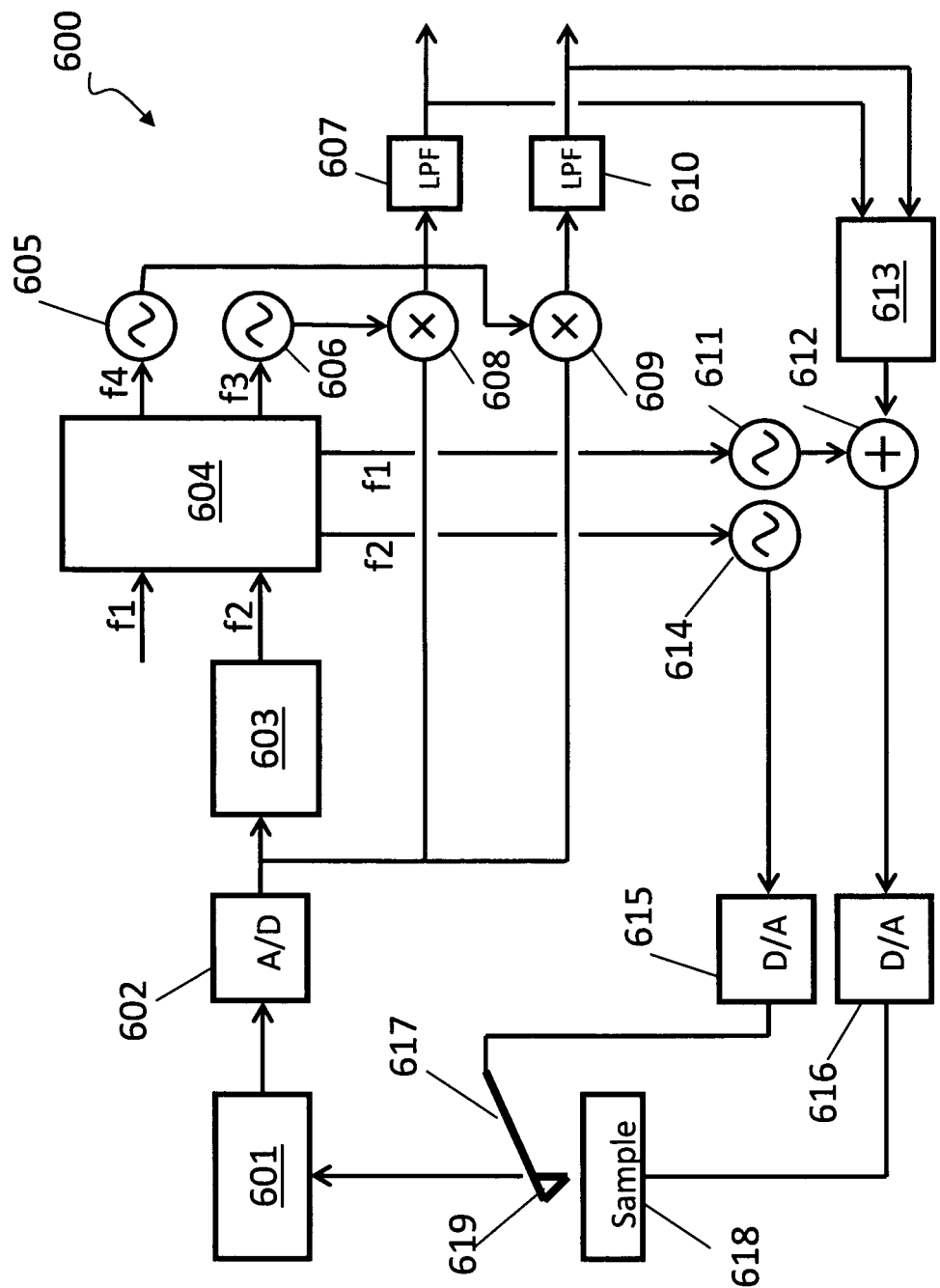
FIG. 8 depicts a schematic representation of a fourth embodiment of an apparatus of the invention applied in scanning probe microscopy for the analysis of surface potential measurements.

FIG. 8 depicts a fourth embodiment 600 of an apparatus of the invention in conjunction with a mechanical oscillator in form of a cantilever 617, the apparatus 600 being applied in scanning probe microscopy for surface potential measurements. Surface potential microscopy is also called KPFM (Kelvin probe force microscopy). The surface potential of a sample 618 shall be measured at high spatial resolution. FIG. 8 shows the cantilever 617 that forms a part of the non-depicted scanning probe microscope. The cantilever 617 comprises a fine tip 619 with a probe that is moved along the surface of the sample 618 to be scanned. The x-, y-, and z-position (as defined in a three-dimensional Cartesian coordinate system) of the cantilever tip 619 with respect to the sample 618 can be adjusted by the scanning probe microscope in various ways known to a person skilled in the art. The oscillation of the cantilever 617 is measured by a deflection detector 601 and digitized by an analogue-to-digital converter 602 that preferably forms part of the apparatus 600 of the invention.

The apparatus 600 comprises a frequency detector 603 in form of a phase-locked loop that tracks the frequency f2 of the oscillation of the cantilever 617, the digitized oscillation being the input signal to the phase-locked loop 603. The apparatus 600 comprises an arithmetic unit 604 with the tracked frequency f2 of the oscillation of the cantilever 617 and a predefined second frequency f1 as incoming signals. As being the case for the tracked frequency f2, the second predefined frequency f1 preferentially depends on the physical system to be measured, i.e. in this case on the topography of the surface of the sample 618 and/or on the electrostatic interaction between the tip 619 and the sample 618. It can e.g. be given by the time constant and/or damping ratio of the physical system under investigation. It is referred to the above description of FIGS. 5a and 5b for further options for choosing the predefined second frequency f1.

The arithmetic unit 604 derives from the tracked frequency f2 of the oscillation of the cantilever 617 and from the second predefined frequency f1 the control signals f3 and f4 for the oscillators 605, 606. For this particular application the control signal f3 is given by the sum of the tracked frequency f2 and the second predefined frequency f1, i.e. f3=f2+f1, and the control signal f4 is given by the difference between the tracked frequency f2 and the second predefined frequency f1, i.e. f4=f2−f1. Thus, the control signals f3 and f4 are reference frequencies representing sideband frequencies of a signal with a fundamental frequency f2 that has been modulated with a modulation frequency f1. The input signal is then directly demodulated at these sideband frequencies f3 and f4 by means of the mixers 608 and 609 yielding output signals of the mixers 608, 609 with the amplitude and phase of the input signal demodulated at the sideband frequency f2+f1 (generated by the mixer 608) and with the amplitude and phase of the input signal demodulated at the sideband frequency f2−f1 (generated by the mixer 609). The output signals of the mixers 608, 609 are preferably low-pass filtered by low-pass filters 607, 610.

The tracked frequency f2 of the input signal is fed back from the arithmetic unit 604 to an oscillator 614 and the output signal of the oscillator 614 is fed via a digital-to-analogue converter 615 to the cantilever 617 used for obtaining the topographic information of the surface of the sample 618. The feedback path relating to the tracked frequency f2 from the arithmetic unit 604 to the cantilever 617 or its tip 619, respectively, is accordingly also called topographic feedback path. The phase-locked loop 603 thus drives the cantilever tip 19 continuously at its resonance/oscillation frequency f2.

The predefined second frequency f1 is fed back from the arithmetic unit 604 to a further oscillator 611 and the output signal of the oscillator 611 is then fed to an adder 612 where an output signal of a controller 613, in particular a PID-controller (Proportional-Integral-Derivative-controller), is added to the output signal of the oscillator 611. The incoming signals of the controller 613 are given by the output signals of the low-pass filters 607, 610. The output signal of the controller 613 constitutes an offset voltage that depends on the amplitude and phase at the sidebands of the tracked input signal of the oscillation of the cantilever 617. The output signal of the controller 613 thus creates an offset in the output signal of the oscillator 611. The sum of the output signals of the oscillator 611 and the controller 613 is then via a digital-to-analogue converter 616 fed to the sample 618 to measure the electrostatic force between the tip 619 of the cantilever 617 and the sample 618. Thus for measuring the electrostatic force between the tip 619 and the sample 618 the low-pass filtered amplitude and phase of the input signal demodulated at the sideband frequencies f2+f1 and f2−f1 are employed. The feedback path relating to the predefined second frequency f1 from the arithmetic unit 604 to the sample 618 is also called surface potential feedback.

A further possible application of the apparatus according to the invention is the tracking of an oscillator resonance frequency with the frequency detector of the apparatus of the invention being formed as phase-locked loop, while concurrently measuring the harmonic and/or a higher oscillation mode with a lock-in amplifier of which the oscillators, the mixers and possible low-pass filters of the apparatus of the invention form part. The frequency tracked by the phase-locked loop constitutes the reference frequency for the lock-in amplifier.

If the apparatus of the invention comprises two frequency detectors in form of phase-locked loops then two oscillation modes may be tracked and driven by the phase-locked loops. Analysis/demodulation at intermodulation frequencies may be performed with a lock-in amplifier comprising oscillators, mixers and possible low-pass filters.

The presented embodiments 300, 400, 500, 600 of the apparatus of the invention are preferably implemented as digital circuits so that problems with offset and drift can advantageously be avoided which might lead to disturbances in the signal(s) of interest. Of course, implementations as analogue circuits are possible. In a digital implementation all signal processing units such as frequency detectors, arithmetic units, oscillators, mixers, low-pass filters besides the analogue-to-digital converters and the digital-to-analogue converters are preferably implemented using error-free digital numbers. A digital implementation has the further advantage that sine waves can be generated using direct digital synthesis (DDS) which incorporates a phase step and a phase accumulator, thereby enabling a straightforward implementation of arithmetic operations on frequencies.

It is to be understood that while certain embodiments of the present invention have been illustrated and described herein, it is not to be limited to the specific embodiments described and shown.

The invention claimed is:

1. An apparatus for demodulating an input signal, the apparatus comprising:
    a frequency detector for tracking a frequency of the input signal, an oscillator and a mixer,
    wherein incoming signals for the mixer consist of the input signal, and an output signal of the oscillator, and the demodulated signal consists of the output signal of the mixer,
    wherein an arithmetic unit is arranged downstream of the frequency detector and upstream of the oscillator,
    wherein the incoming signals of the arithmetic unit consist of the tracked frequency of the input signal and a predefined frequency; and
    the arithmetic unit is configured to compute a control signal for the oscillator from the tracked frequency of the input signal and the predefined frequency with the output signal of the oscillator depending on the control signal.

2. The apparatus according to claim 1, wherein a low-pass filter is arranged downstream the mixer.

3. The apparatus according to claim 1, wherein the tracked frequency of the input signal is its carrier frequency and/or wherein the predefined frequency is the modulation frequency by which the input signal has been modulated.

4. The apparatus according to claim 1, wherein the control signal is given by a reference frequency for the oscillator.

5. The apparatus according to claim 4, wherein the reference frequency is given by the difference or the sum of the tracked frequency of the input signal and the predefined frequency.

6. The apparatus according to claim 1, wherein the arithmetic unit is configured to compute a second control signal for a second oscillator from the tracked frequency of the input signal and the predefined frequency with the output signal of the second oscillator depending on the second control signal, wherein the second oscillator is connectable to a device to be tested.

7. The apparatus according to claim 1, wherein the second control signal is given by a reference frequency for the second oscillator.

8. The apparatus according to claim 1, wherein several frequency detectors for tracking several frequencies of the input signal, several mixers and several oscillators are provided with one oscillator assigned to each mixer,
    wherein the incoming signals of the arithmetic unit consist of the tracked frequencies of the input signal and several predefined frequencies, and
    the arithmetic unit is configured to compute a control signal for each oscillator from the tracked frequencies of the input signal and the several predefined frequencies, each output signal of an oscillator depending on the corresponding computed control signal, and the incoming signals for one of the mixers consist of each output signal of the oscillator together with the input signal.

9. The apparatus according to claim 8, wherein the oscillators are connectable to one or more devices to be tested.

10. A method for demodulating an input signal with an apparatus according to claim 1, the method comprising the following steps:
    tracking of a frequency of the input signal by a frequency detector;
    computing a control signal from the tracked frequency of the input signal and a predefined frequency by means of an arithmetic unit;
    generating an output signal of an oscillator in dependence on the computed control signal; and
    demodulating the input signal by mixing the input signal with the output signal of the oscillator using a mixer.

11. The method according to claim 10, wherein the demodulated input signal is low-pass filtered.

12. The method according to claim 10, wherein the control signal is computed by subtracting the predefined frequency from the tracked frequency or by adding the predefined frequency to the tracked frequency.

* * * * *